(12) United States Patent
Allenspach et al.

(10) Patent No.: US 7,897,411 B2
(45) Date of Patent: Mar. 1, 2011

(54) NON-VOLATILE RESISTANCE SWITCHING MEMORY

(75) Inventors: Rolf Allenspach, Adliswil (CH);
Johannes G. Bednorz, Wolfhausen (CH); Gerhard Ingmar Meijer, Zurich (CH); Chung Hon Lam, Peekskill, NY (US); Richard Stutz, Dottikon (CH); Daniel Widmer, Langnau (CH)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 11/105,849

(22) Filed: Apr. 14, 2005

(65) Prior Publication Data

US 2005/0260839 A1  Nov. 24, 2005

(30) Foreign Application Priority Data

Apr. 16, 2004  (EP) .................................. 04405239

(51) Int. Cl.
*H01L 21/00* (2006.01)
(52) U.S. Cl. .................. 438/3; 257/2; 257/E47.001
(58) Field of Classification Search ............... 438/3; 257/2, E47.001
See application file for complete search history.

(56) References Cited

U.S. PATENT DOCUMENTS 5,856,242 A * 1/1999 Arai et al. .................... 438/770
6,326,315 B1 * 12/2001 Uchiyama et al. ........... 438/758
6,762,481 B2 * 7/2004 Liu et al. ..................... 257/595
2002/0196654 A1 * 12/2002 Mitarai et al. ............... 365/145
2003/0148545 A1 * 8/2003 Zhuang et al. ................. 438/3
2004/0036571 A1 * 2/2004 Chen et al. ................. 338/32 R
2004/0180542 A1 * 9/2004 Nagashima et al. ......... 438/679

OTHER PUBLICATIONS

Beck et al., "Reproducible Switching Effect in Thin Oxide Films for Memory Applications," Applied Physics Letters, AIP Jul. 3, 2000, vol. 77, No. 1, pp. 139-141.
Ikuta K., et al., "Low-Temperature Deposition of SrTiO3, Thin Films by Electron-Cyclotron-Resonance Sputtering for Monolithic Microwave Integrated Circuits Operating in the mm-Wave Band," Japanese Journal of Applied Physics, Apr. 1998, vol. 37, No. 4A, pp. 1960-1963.
Nishitsuji M. et al., "New GaAs-MMIC process technology using low-temperature deposited SrTiO3, thin film capacitors," Electronics Letters, Jun. 23, 1994, vol. 30, No. 13, pp. 1045-1046.

* cited by examiner

*Primary Examiner*—Steven J Fulk
(74) *Attorney, Agent, or Firm*—Michael J. Buchenhorner; Vazken Alexanian

(57) ABSTRACT

Processes, apparatus and systems for depositing a switching material that is switchable between conductivity states and where the states are persistent. The invention further relates to a microelectronic device or non-volatile resistance switching memory comprising the switching material for storing digital information. A process includes a step of depositing the switching material by a CMOS deposition technique at a temperature lower than 400° C.

10 Claims, 6 Drawing Sheets

NON-VOLATILE RESISTANCE SWITCHING MEMORY

TECHNICAL FIELD

The present invention is related to a process for depositing a switching material that is switchable between conductivity states and where the states are persistent. The invention further relates to a microelectronic device or non-volatile resistance switching memory comprising the switching material for storing digital information.

BACKGROUND OF THE INVENTION

Non-volatile resistance switching memory, particularly memory based on complex metal oxides, is typically either deposited at high temperature, usually at about 800° C., or requires high temperature post-deposition annealing. This makes it impossible to integrate this type of memory in a back end of the line (BEOL) process with standard complementary-metal-oxide-semiconductor (CMOS) technology. For far BEOL integration the allowed temperatures are even more stringent.

Liu et al., Electrical-pulse-induced reversible resistance change effect in magnetoresistive films, Applied Physics Letters, 76, 2749, 2000 and the international publication WO00/15882 relate to a perovskite layer deposited epitaxially (single crystalline) at elevated temperature by pulsed laser deposition on a substrate. This deposition technique cannot be used for standard CMOS technology.

US20030148545A1 shows a way of manufacturing a variable resistor device based on poly-crystalline perovskite metal oxides using spin-coating deposition techniques. Silicon substrates can be used with the techniques of manufacturing. An annealing process step of the spin-coated layer between 400° C. and 700° C. is however required to obtain switching between a first resistance state and a second resistance state in the respective devices.

From the above it follows that there is still a need in the art for a process for manufacturing resistance switching memory based on a complex metal oxide such that (far) BEOL integration with standard CMOS technology becomes possible.

SUMMARY OF THE INVENTION

Thus, in accordance with the present invention, there is provided a process for depositing a switching material that is switchable between at least a first conductivity state and a second conductivity state, each of the states being persistent. The process comprising a step of depositing the switching material by a standard complementary-metal-oxide-semiconductor (CMOS) deposition technique at a temperature lower than 400° C. In other words, the switching material is deposited such as to form an essentially amorphous or poly-crystalline layer. That is, the switching material has an amorphous or poly-crystalline structure resulting from the used deposition temperature. The process can be used for manufacturing microelectronic devices comprising a non-volatile resistance switching memory element between two electrodes.

In accordance with a second aspect of the present invention, there is provided a microelectronic device for storing digital information comprising a switching material deposited according to the disclosed process.

The process of the present invention allows that all steps can be performed at temperatures below 400° C. This makes the preferred (far) BEOL integration of non-volatile resistance switching memory based on complex metal oxides with standard CMOS technology possible.

In an advantageous embodiment radio frequency (RF) sputtering is used as the PVD technique because it is a reliable deposition process with high wafer throughput and cost effective manufacturing. DC sputtering might also be applied.

DESCRIPTION OF THE DRAWINGS

Advantageous embodiments of the invention are described in detail below, by way of example only, with reference to the following drawings.

Figure 1:
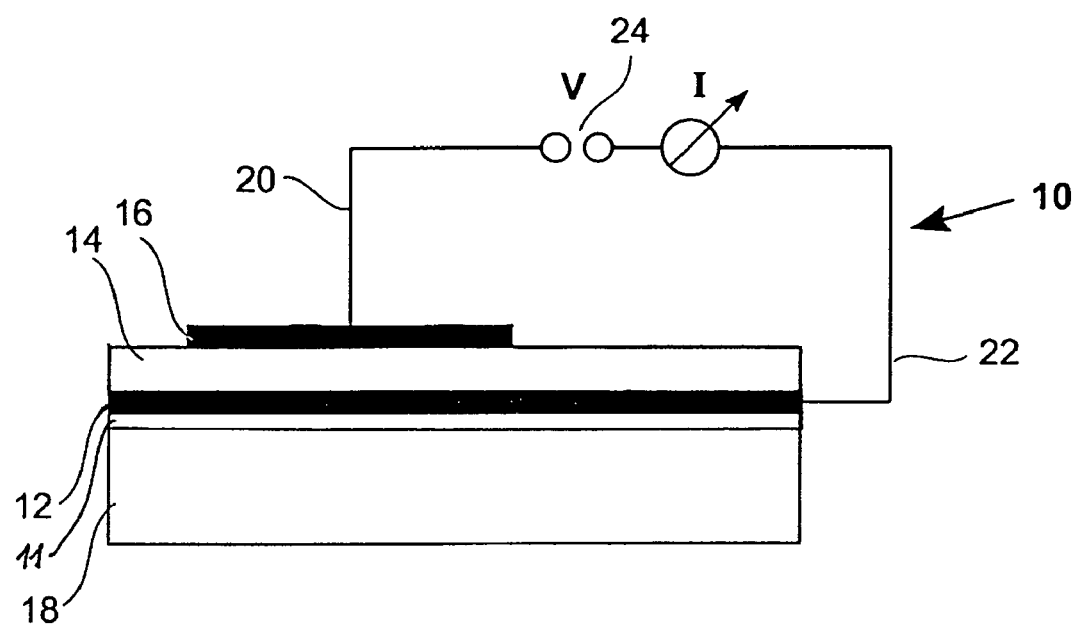
FIG. 1 shows a schematic drawing of a microelectronic device having a non-volatile resistance switching memory element.

The drawings are provided for illustrative purposes only.

DETAILED DESCRIPTION OF THE INVENTION

The present invention provides a process for depositing a switching material that is switchable between at least a first conductivity state and a second conductivity state, each of the states being persistent. An example of a process comprises a step of depositing the switching material by a standard complementary-metal-oxide-semiconductor (CMOS) deposition technique at a temperature lower than 400° C. In other words, the switching material is deposited such as to form an essentially amorphous or poly-crystalline layer. That is, the switching material has an amorphous or poly-crystalline structure resulting from the used deposition temperature.

The process can be used for manufacturing microelectronic devices comprising a non-volatile resistance switching memory element between two electrodes. The switching material provides the functionality of the non-volatile resistance switching memory element, herein also referred to as switching member or switching layer. The switching layer can be formed on a substrate by physical vapor deposition (PVD) at a temperature lower than 400° C. This has the advantage that no annealing processes are required afterwards. The switching member layer can be essentially amorphous or poly-crystalline. Its resistance can be reversibly switched between at least a first resistance state and a second resistance state, each of the at least two states being persistent. The switching of the resistance between the first and second resistance state can be controlled by electrical voltage or current pulses.

In accordance with a second aspect of the present invention, there is provided a microelectronic device for storing digital information comprising a switching material deposited according to the disclosed process.

The disclosed process allows that all process steps can be performed at temperatures at, below and above 400° C. This makes the preferred (far) BEOL integration of non-volatile resistance switching memory based on complex metal oxides with standard CMOS technology possible. When after the deposition step no annealing process step is applied, then the total processing time can be reduced and the manufacturing time of microelectronic devices having the deposited switching material can be shortened. Moreover the manufacturing cost can be reduced. The switching material is reversibly switchable between at least a first conducting state and a second conducting state.

Physical vapor deposition (PVD) can be used as deposition technique for the switching material, but also metal organic chemical vapor deposition (MOCVD) can be used. Molecular Beam Epitaxy (MBE) might also be applied.

In PVD atoms of a heavy, but inert gas, typically argon, are electrically accelerated towards a target. These atoms chip off or "sputter" the target material, atom by atom. The sputtered atom lands on the wafer surface, where it forms a solid layer. In metal organic chemical vapor deposition (MOCVD) a gas containing a metal and/or insulator chemistry is sprayed on the wafer. These gases react on the wafer surface, forming a thin film of solid material. Energy sources such as heat and radio frequency power are used alone or in combination to achieve this reaction.

In an advantageous embodiment radio frequency (RF) sputtering is used as PVD technique because it is a reliable deposition process with high wafer throughput and cost effective manufacturing. DC sputtering might also be applied.

A transition metal oxide can be used as the switching material that is also referred to as perovskite, complex metal oxide, or complex metal oxide resistance switching material, which, for example, can comprise $SrTiO_3$ doped with Chromium (Cr) or $SrZrO_3$ doped with Cr. As an alternative to Cr other transition metal elements could be used.

The switching material can be deposited on a substrate having a temperature between approximately room temperature and 400° C. The deposition of the switching material can be performed below approximately 100° C. Then, the switching material is essentially amorphous whilst a deposition at approximately 400° C. leads to a switching material having a poly-crystalline structure which could also be desired.

It is advantageous to deposit the switching material at room temperature. This does not require any heating.

FIG. 1 shows a schematic sectional view of a non-volatile resistance switching memory device 10 having a capacitor-like structure. Such a microelectronic device is useable as a memory cell or within an array as cross-point memory. On a substrate 18 a stack-like arrangement of a first or base electrode 12, a non-volatile resistance switching memory element or switching member 14, and a second or top electrode 16 is formed. An insulating buffer layer 11 may be included between the substrate 18 and the first electrode 12. One terminal 20 is connected to said top electrode 16, the other terminal 22 is connected to the first electrode 12. The leakage current can be measured as it is depicted in the drawing as a function of the bias voltage generated by a DC voltage source 24 between said terminals 20, 22. In an experimental arrangement setup for testing the basic switching behavior and further physical properties of the device 10 the switching member layer thickness was approximately 150 nanometers.

The switching member's resistance can be reversibly switched between at least a first resistance state and a second resistance state; thereby each of the states is persistent. The switching of the resistance between the first and second resistance state is controlled by, for example, electrical voltage or current pulses as described in the international application with publication no. WO 00/49659, presently assigned to the assignee of the instant application and the disclosure of which is incorporated herein by reference.

A variety of materials can be used advantageously for the substrate 18, the insulating buffer layer 11, the first electrode 12, the switching member 14, and the second electrode 16. For a stand-alone non-volatile resistance switching memory application the substrate 18 may consist of Silicon or Silicon on Insulator (SOI) wafers. Other substrates such as Silicon Germanium, Gallium Arsenide, non-crystalline materials, i.e. glass, or Quartz wafers could also be considered. For an embedded non-volatile resistance switching memory application Silicon (or SOI) wafers that are processed up to the BEOL in a standard CMOS logic process could be used as substrate 18.

The compound that is deposited as the first electrode layer may be any number of different types of metals, such as Pt, Ti, W, Ta, Ru, Cu, semiconductor, metallic oxide, etcetera. Conventional methods of deposition, such as physical vapor deposition or chemical vapor deposition may be used to deposit the first electrode layer. Other possibilities for the first electrode 12 include aluminum that has long been the conductor of choice for standard CMOS technology, or the current material of choice for on-chip metallization, Damascene electroplated copper. Other metals may also be used as first electrode layer. A chemical-mechanical polishing process may be included for planarizing or removing excess material from the surface of the wafer. This process step presents a smooth top surface for further processing.

The switching member 14 or switching member layer 14 is prepared by physical vapor deposition (PVD). PVD is a reliable production process with typically high wafer throughput and cost effective manufacturing. A preferred PVD production tool meets the international SEMATECH performance metrics and factory guidelines for CMOS semiconductor factories.

Immediately prior to the PVD process the wafers 18 are preferably cleaned in-situ. The wafers may be degassed in vacuum with radiation heaters. In addition typically a plasma sputtering step or reactive ion etching cleaning process is included to assure clean surfaces and good adhesion. For example, a plasma sputter cleaning process could include a few minutes inverse sputter etching in Argon (Ar) plasma, with a 13.56 MHz radio frequency (RF) power of 100 W on 8 inch, while a pressure of 6 μbar is maintained in the vacuum chamber. The pre-clean etch uniformity total variability is preferentially below 3% (3σ). For example, the PVD process to deposit the switching member layer 14 can be done under a condition in which the wafer temperature is between approximately room temperature and 400° C. The base pressure of the vacuum system is preferably below $10^{-5}$ mbar. The RF power may be controlled between 100 and 2000 W. In addition a RF bias can be applied to tune the deposited layer compressive stress on Si wafers to values between 0 and 300 MPa. The pressure range can be maintained between about 1 μbar and 50 μbar. A mixture of at least Ar and Oxygen ($O_2$) gasses is used in the sputtering process. Suitable gas ratios Ar:$O_2$ range between 5:1 and 1:5. The flow rate of Ar and $O_2$ typically is between 1 and 100 sccm. The PVD process target for the switching member thickness can be chosen between about 10 nm and 1 μm. The advantageous film thickness uniformity total variability is below 3% (3σ).

Good results have particularly been achieved using sintered sputtering targets comprising stoichiometric $SrTiO_3$, $SrZrO_3$, other materials with perovskite structure, or perovskite-like structure, or combinations thereof, each material preferably doped with up to about 20% Cr, V, or Mn. Advantageously the chemical purity of the target is at least 2N8.

In an advantageous embodiment the switching member 14 as an approximately 150 nm thick layer of $SrTiO_3$ doped with 0.2 mol % Cr or $SrZrO_3$ doped with 0.2 mol % Cr is deposited at a temperature of 100° C. A mixture of Ar and $O_2$ with ratio 1:1 is used for the sputtering process. A 13.56 MHz RF power of 600 W on the 8 inch target is used. The pressure during PVD is maintained at 20 μbar. The compressive stress in the characteristic switching layer is about 50 MPa. No further annealing process steps are required.

The metal that is deposited for the second electrode 16 may be any number of different types of metals, such as Pt, Ti, W, Ta, Ru, Al, Cu, etcetera. Conventional methods of low temperature deposition may be used to deposit the top electrode layer. Other metals may also be used as second electrode layer.

Figure 2:
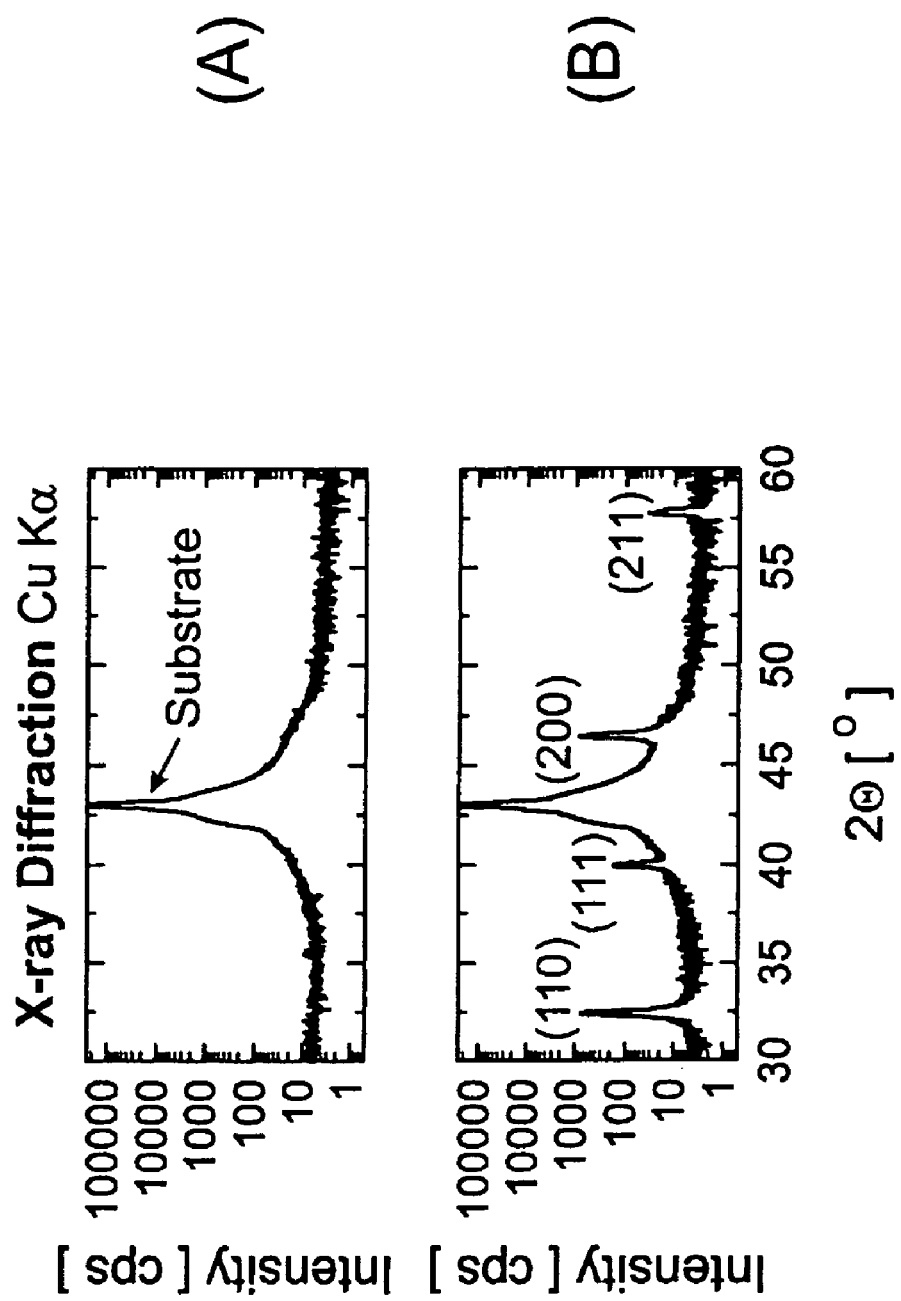
FIG. 2(A) shows an X-ray diffraction spectrum (Cu K$\alpha$, $\lambda$=1.5406 Å) of an amorphous Cr-doped $SrTiO_3$ layer deposited at T=100° C.
FIG. 2(B) shows an X-ray diffraction spectrum (Cu K$\alpha$, $\lambda$=1.5406 Å) of a poly-crystalline Cr-doped $SrTiO_3$ layer deposited at T<400° C. Bragg peaks are indexed in the conventional (h,k,l)-notations.

FIG. 2(A) displays an X-ray diffraction spectrum (Cu Kα, λ=1.5406 Å) of an approximately 150 nm thick layer of the switching member 14. In this case a Cr-doped $SrTiO_3$ layer was deposited at T=100° C. No Bragg peaks, apart from the substrate diffraction peak, are present. This indicates that the deposited Cr-doped $SrTiO_3$ switching member is essentially amorphous.

FIG. 2(B) displays an X-ray diffraction pattern (Cu Kα, X=1.5406 Å) of an approximately 150 nm thick layer of the switching member 14. In this case a Cr-doped $SrTiO_3$ layer was deposited at T<400° C. The diffraction spectrum of a poly-crystalline perovskite is obtained; this indicates that the deposited Cr-doped $SrTiO_3$ switching member is essentially poly-crystalline.

As mentioned above, the reversible switching of the resistance between a first resistance state and a second resistance state is controlled by, for example, electrical voltage or current pulses as described in the international application with publication no. WO 00/49659.

Figure 3:
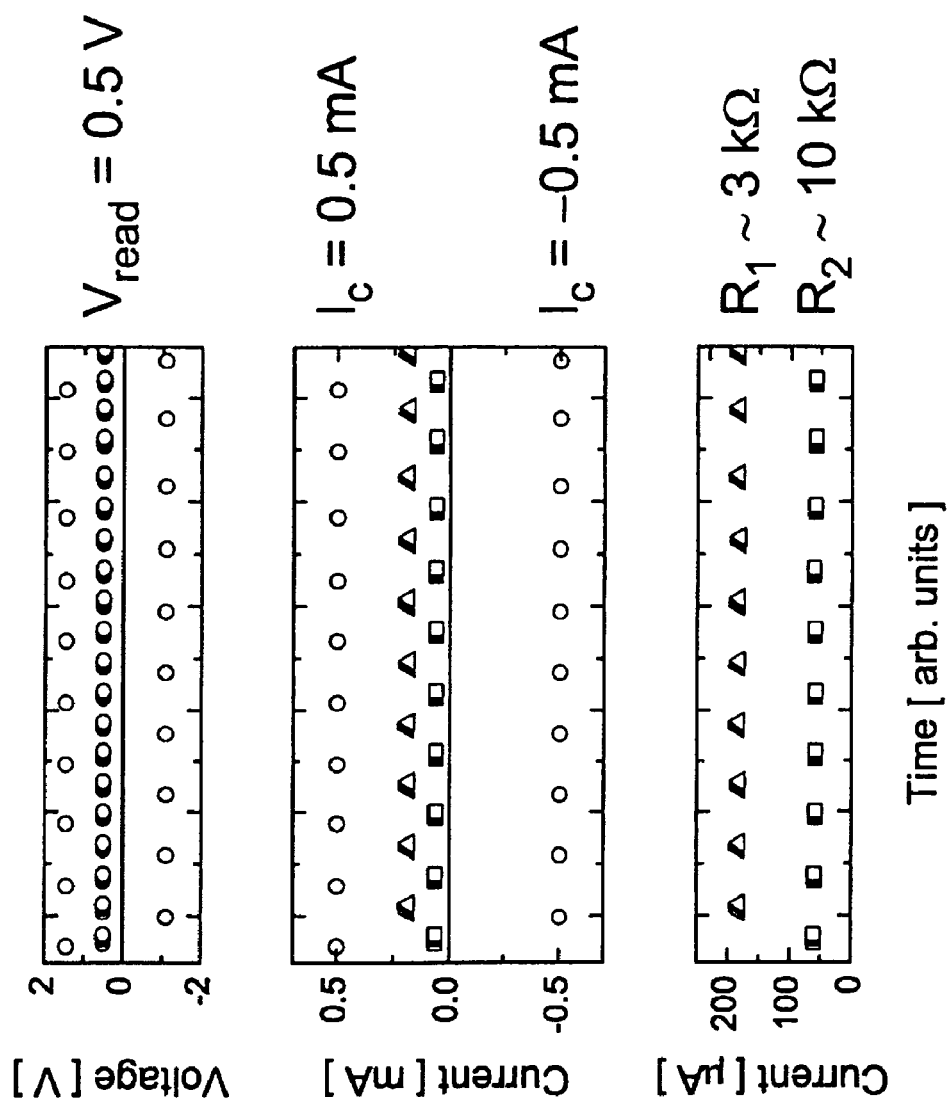
FIG. 3 shows a typical reversible switching between a first resistance state and a second resistance state, each of the two states being persistent, of a device having a switching member comprising an essentially amorphous Cr-doped $SrTiO_3$ layer deposited at T=100° C.

FIG. 3 shows a typical reversible switching between a first resistance state and a second resistance state of the non-volatile resistance switching memory device 10, each of the two states being persistent, comprising an essentially amorphous Cr-doped $SrTiO_3$ switching member deposited at T=100° C. The first and second electrode 12, 16 is 100 nm Pt deposited at room temperate using PVD processes known in the art. A current pulse of $|I_c|$=0.5 mA between the first and second electrode 12, 16 is used to control the resistance state of the device 10. The resistance state is determined with a read voltage pulse of $V_{read}$=0.5 V between the first and second electrode 12, 16. The device 10 has a first resistance state of $R_1$~3 kΩ and a second resistance state of $R_2$~10 kΩ; $R_2/R_1$~3.

Figure 4:
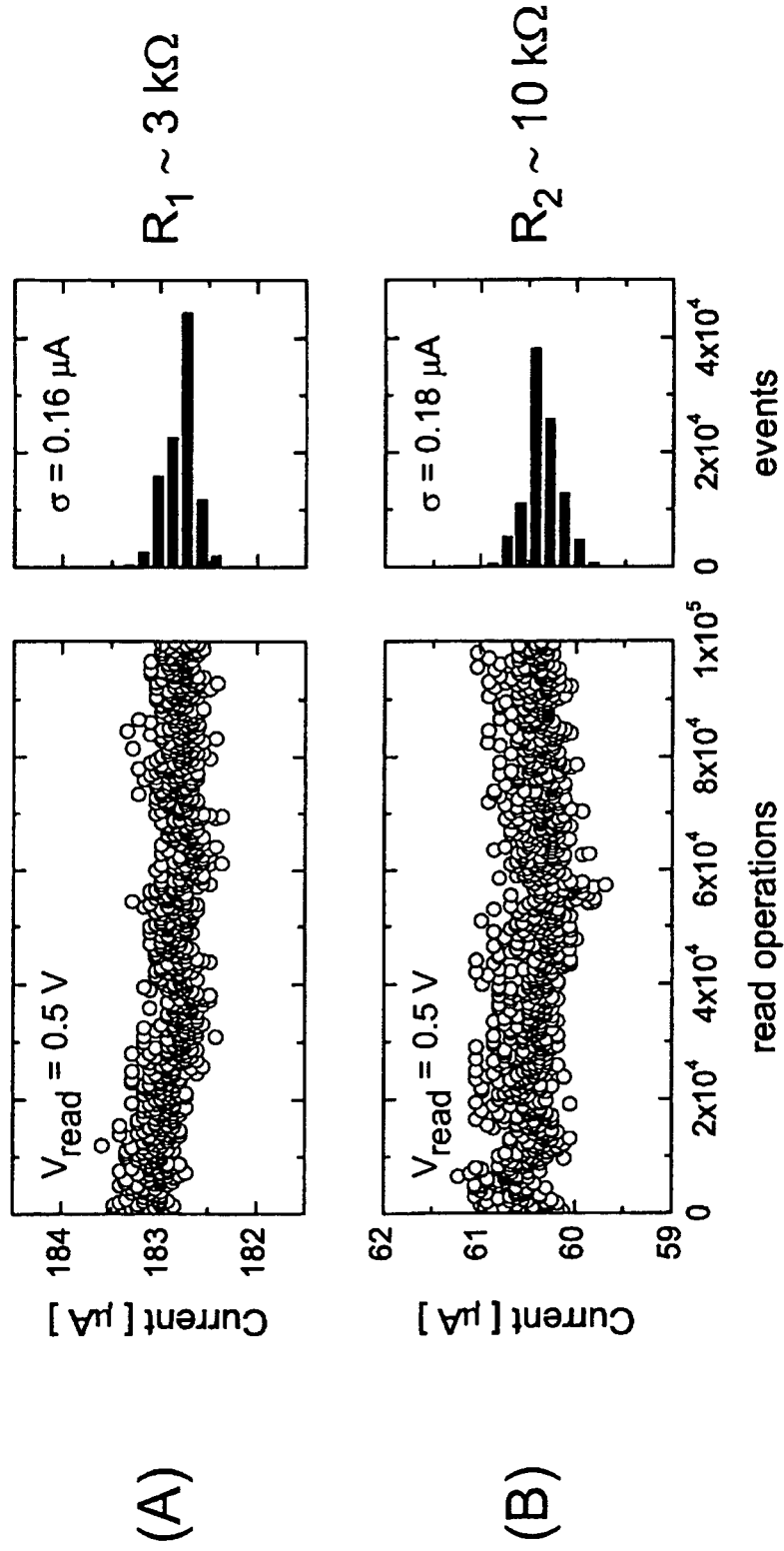
FIGS. 4(A) and 4(B) show the endurance of the first resistance state and the second resistance state, respectively, each of the two states being persistent, of the device having a switching member with an essentially amorphous Cr-doped $SrTiO_3$ layer deposited at T=100° C.

FIGS. 4(A) and 4(B) show the endurance of the first resistance state and the second resistance state of the device 10, comprising the switching member 14 with the essentially amorphous Cr-doped $SrTiO_3$ layer deposited at T=100° C. The first and second electrode 12, 16 is 100 nm Pt deposited at room temperate using PVD processes known in the art. $10^5$ read voltage pulses of $V_{read}$=0.5 V are applied between the first and second electrode 12, 16 of 0.5 V to read the resistance state during approximately 2 hours. No control current pulses of $|I_c|$=0.5 mA are applied during this time. A narrow distribution of the resistance, or equivalently, the current flow, in the first and second state is obtained ($\sigma_1$=0.16 μA and $\sigma_2$=0.18 μA).

Figure 5:
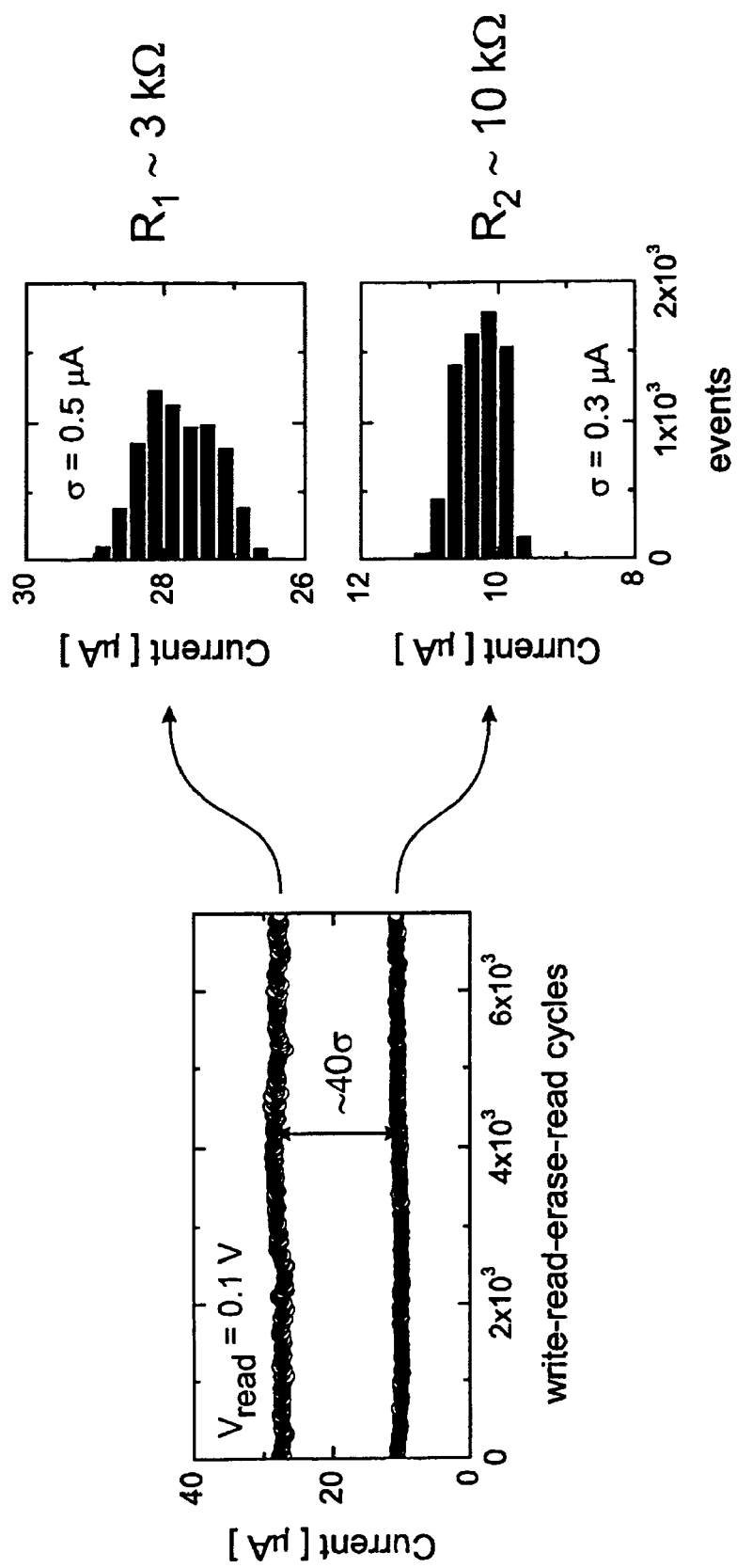
FIG. 5 shows a bit-error-rate of the device with a switching member comprising an essentially amorphous Cr-doped $SrTiO_3$ layer deposited at T=100° C.

FIG. 5 shows a bit-error-rate of the device 10 with the essentially amorphous Cr-doped $SrTiO_3$ switching layer deposited at T=100° C. The first and second electrode 12, 16 is 100 nm Pt deposited at room temperate using PVD processes known in the art. A long sequence of consecutive write control current pulses of $I_c$=0.5 mA, read voltage pulses of $V_{read}$=0.5 V, erase control current pulses of $I_c$=−0.5 mA, and read voltage pulses of $V_{read}$=0.5 V is applied between the first and second electrode 12, 16. A narrow distribution of the resistance, or equivalently, the current flow, in the first and second state is obtained ($\sigma_1$=0.5 μA and $\sigma_2$=0.3 μA). This shows that a well defined separation of approximately 40σ between the two states can be obtained with the device 10 comprising the essentially amorphous Cr-doped $SrTiO_3$ layer deposited at T=100° C.

Figure 6:
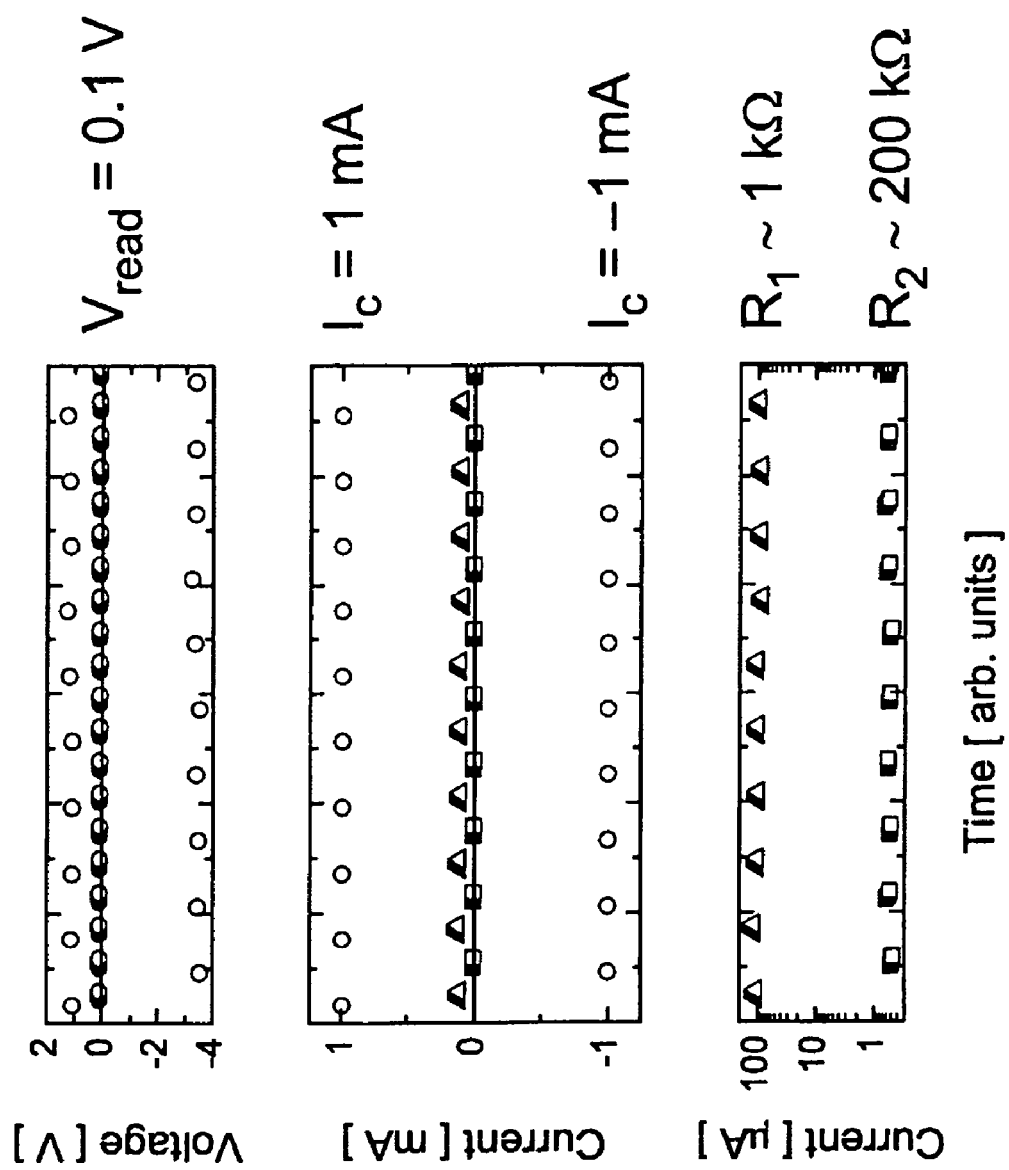
FIG. 6 shows reversible switching between a first resistance state and a second resistance state, each of the two states being persistent, of the device having a switching member with an essentially amorphous Cr-doped $SrTiO_3$ layer deposited at T=100° C. for optimized control current conditions.

The reversible switching of the resistance between a first resistance state and a second resistance state can be further optimized by tuning the control current pulses. FIG. 6 shows a reversible switching between the first resistance state and the second resistance state of the device 10 comprising the essentially amorphous Cr-doped $SrTiO_3$ switching layer deposited at T=100° C. The first and second electrode 12, 16 is 100 nm Pt deposited at room temperate using PVD processes known in the art. A current pulse of $|I_c|$=1 mA between the first and second electrode 12, 16 is used to control the resistance state of the device 10. The resistance state is determined with a read voltage pulse of $V_{read}$=0.1 V between the first and second electrode 12, 16. The device 10 has here a first resistance state of $R_1$~1 kΩ and a second resistance state of $R_2$~200 kΩ; $R_2/R_1$~200.

It is noted that any disclosed embodiment may be combined with one or several of the other embodiments shown and/or described. This is also possible for one or more features of the embodiments.

Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention.

The present invention can be realized in hardware, or a combination of hardware and software. A visualization tool according to the present invention can be realized in a centralized fashion in one computer system, or in a distributed fashion where different elements are spread across several interconnected computer or other systems. Any kind of computer system—or other apparatus adapted for carrying out the methods and/or functions described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to control the carrying out of these methods. Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing and controlling a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing control of one or more functions of this invention.

Thus, the invention includes a program storage device readable by machine, tangibly embodying a program of instructions executable by the machine to perform steps for controlling deposition of a switching material. The steps of controlling are for controlling the method steps of this invention.

The invention includes an apparatus comprising means for depositing a switching material. The switching material being switchable between at least a first conductivity state and a second conductivity state, each of the states being persistent. The means for depositing comprising means for depositing the switching material by a CMOS deposition technique at a temperature lower than 400° C.

The invention also includes a computer program product comprising a computer usable medium having computer readable program code means embodied therein for causing deposition of a switching material. The computer readable program code means in the computer program product comprising computer readable program code means for causing a computer to effect the control of functions of the present invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

The invention claimed is:

1. A process comprising forming a nonvolatile resistance switching memory element, said step of forming comprising:
   depositing over a substrate a non-volatile resistance switching transition metal oxide material, said switching material being reversibly switchable between at least a first conductivity state and a second conductivity state, each of the states being persistent, wherein the transition metal oxide material is selected from the group consisting of $SrTiO_3$ doped with Chromium and $SrZrO_3$ doped with Chromium;
   wherein depositing the switching material comprises depositing said switching material by a CMOS deposition technique at a temperature lower than 100° C., using a mixture of at least Argon and Oxygen gases in a range of $Ar:O_2$ between 5:1 and 1:5, giving said switching material an amorphous structure resulting from the used deposition temperature such that no post-deposition annealing process is required.

2. The process according to claim 1 wherein the CMOS deposition technique comprises using a technique taken from a group of techniques consisting of: physical vapor deposition; and metal organic chemical vapor deposition.

3. The process according to claim 2 wherein the step of using physical vapor deposition further comprises using radio frequency sputtering.

4. The process according to claim 3, wherein the temperature is room temperature.

5. The process according to claim 3, wherein after the step of depositing the non-volatile resistance switching transition metal oxide material no annealing process step is applied.

6. The process according to claim 2, wherein the temperature is room temperature.

7. The process according to claim 2, wherein after the step of depositing the non-volatile resistance switching transition metal oxide material no annealing process step is applied.

8. The process according to claim 1, wherein the temperature is room temperature.

9. The process according to claim 1, wherein after the step of depositing the non-volatile resistance switching transition metal oxide material, no annealing process step is applied.

10. The process according to claim 1, further selectively comprising capability of implementing any combination of limitations taken from a group of limitations consisting of:
    the CMOS deposition technique comprises using a technique taken from a group of techniques consisting of: physical vapor deposition, and metal organic chemical vapor deposition;
    the step of using physical vapor deposition further comprises using radio frequency sputtering;
    the temperature is one of approximately 100° C. and room temperature after the step of depositing the non-volatile resistance switching material no annealing process step is applied;
    said switching material is a transition metal oxide;
    said switching material is $SrTiO_3$ doped with Chromium;
    said switching material is $SrZrO_3$ doped with Chromium; and
    employing the switching material in forming a microelectronic device for storing digital information.

* * * * *